United States Patent [19]
You et al.

[11] Patent Number: 6,127,074
[45] Date of Patent: Oct. 3, 2000

[54] PHOTORESIST SOLUTION FOR PHOSPHOR SLURRY APPLIED TO COLOR CATHODE RAY TUBE

[75] Inventors: Seung-Jun You, Kyonggi-do; Eak-Cheol Eam, Kyongg-do; Young-Jong Kang, Seoul; Chang-Wook Kim; Gi-Wook Kang, both of Kyonggi-do; Eun-Ha Heo, Seoul, all of Rep. of Korea

[73] Assignee: Samsung Display Devices Co., Ltd., Rep. of Korea

[21] Appl. No.: 09/209,224

[22] Filed: Dec. 11, 1998

[30] Foreign Application Priority Data

Dec. 30, 1997 [KR] Rep. of Korea ........................ 97-79083
Nov. 6, 1998 [KR] Rep. of Korea ........................ 98-47451

[51] Int. Cl.[7] .............................. G03C 5/00; G03F 7/021; G03F 7/012
[52] U.S. Cl. ............................ 430/28; 430/175; 430/196; 430/197
[58] Field of Search .................................. 430/7, 23, 28, 430/175, 196, 197

[56] References Cited

U.S. PATENT DOCUMENTS

| | | | |
|---|---|---|---|
| 4,526,854 | 7/1985 | Watanabe et al. ...................... | 430/176 |
| 4,542,085 | 9/1985 | Takahashi et al. ...................... | 430/158 |
| 4,614,701 | 9/1986 | Mori et al. .............................. | 430/197 |
| 4,681,833 | 7/1987 | Nagasawa et al. ..................... | 430/175 |
| 4,902,602 | 2/1990 | Misu et al. .............................. | 430/175 |
| 4,954,418 | 9/1990 | Koike ...................................... | 430/175 |
| 5,344,353 | 9/1994 | Jang et al. ............................... | 445/45 |
| 5,741,619 | 4/1998 | Aoshima et al. ....................... | 430/175 |

*Primary Examiner*—John S. Chu
*Attorney, Agent, or Firm*—Baker & McKenzie

[57] ABSTRACT

The present invention relates to photoresist solution for phosphor slurry for use in the color cathode ray tube. The photoresist solution of the present invention comprises Diazo or Bisazide photosensitizer; polymer. which is mixed with said Diazo or Bisazide photosensitizer, obtained by polymerization of hydroxy ethyl acrylate base. The photoresist solution of the present invention improves the adhesive strength by using of the Diazo or Bisazide photosensitizer and the polymer, thus the green, blue and red phosphor screen being uniformly formed and the color residue being disappeared. Further, since the photosensitizer not containing heavy metal is used, it does not cause any environmental problem. Also, it can be stored for a long time by using the initiator without hydrochloric acid at the time of polymerization.

12 Claims, No Drawings

PHOTORESIST SOLUTION FOR PHOSPHOR SLURRY APPLIED TO COLOR CATHODE RAY TUBE

BACKGROUND OF THE INVENTION

1. Field of the Invention

The present invention relates to a photoresist solution contained in a phosphor slurry which is applied to a color cathode ray tube(color CRT), and more particularly, to a photoresist solution composed of photosensitizer without heavy metal such as chromium, and an appropriate polymer, so as to improve an adhesive performance and remove a color residue of the color CRT made therewith.

2. Description of the Prior Art

Generally, a phosphor screen of the color CRT displays an image by exciting phosphor material deposition thereon. The phosphor screen is consisting of green, blue and red phosphor patterns and a black matrix disposed between the patterns.

The process for forming a black matrix comprises the steps of coating the photoresist on the inner surface of a panel, i.e., a front glass of the color CRT, coating graphite emulsion thereon, exposing it to light and developing to form a black matrix with graphite lines.

The process for forming green, blue and red phosphor patterns is called as a slurry process. The slurry process comprises the steps of cleaning the inner surface of the panel on which the black matrix was formed, and coating slurry, which is a mixture of the photoresist solution and a phosphor, on the inner surface of the panel. The slurry is prepared by mixing sodium dichromate in polyvinyl alcohol aqueous solution and suspending the phosphor therein.

A small quantity of surfactant is added to the slurry in order to improve the affinity for the front glass and the coating characteristics. After coating the slurry on the inner surface of the panel, the panel is rotated With 150 to 250 rpm to uniformly spread the slurry, and it is dried by the blower with an infrared heater. During the drying process, a covalent bond is formed on the inner surface of the front glass by an esterification reaction, and then the exposure step is proceeded.

The exposure step is to expose the black matrix and the photoresist solution of the slurry to an ultra violet light, so as to cure the polyvinyl alcohol and the sodium dichromate. By exposing the polyvinyl alcohol and the sodium dichromate to the ultraviolet light, they become insoluble to the water.

After the exposure step, the developing step is performed by washing off the uncured slurry from the panel with warm water, whereby the phosphor patterns are formed, in which phosphor cured by ultraviolet light is remained. The phosphor patterns are dried to be solidified by heater drying.

In prior art, polyvinyl alcohol polymer, and sodium dichromate as photosensitizer have been used in the step for forming the phosphor patterns. The chemical structure of polyvinyl alcohol polymer is as follows:

Formula 1

PVA (Poly vinyl alcohol) Polymer

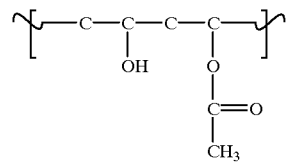

However, the adhesive strength cf the red phosphor is relatively lower than those of the green and the blue phosphor. Thus, it is difficult to form uniform layer of phosphor screen and the color residue occurs in the color CRT made therewith. Further, the photoresist solution which contains the forbidden heavy metal, such as, chromium causes the environmental problems.

Also in the prior art, as an initiator for polymerizing, V-50 [(Wako chemical, 2,2'-Azobis (2-amino propane) dihydrochloride] is used.

However, there are problems that a Diazo photosensitizer is decomposed by hydrochloric acid contained in the initiator with the passage of time, and the stability is thus degraded in storage.

SUMMARY OF THE INVENTION

The object of the present invention is to improve the adhesive strength of the phosphor slurry by using a Diazo or a Bisazide photosensitizer without heavy metal and an appropriate polymer, so that the uniform phosphor screen is formed to remove the color residue of the color CRT made therewith.

In order to achieve the above object, the present invention provides photoresist solution characterized in that the Diazo or the Bisazide photosensitizer is used instead of sodium dichromate in the prior art, and the above photosensitizer is mixed with a polymer based on hydroxy ethyl acrylate (HEA).

Here, as the Diazo photosensitizer, a compound condensing 4-diazo diphenylamine disulfate with aldehyde compound is used, and diphosphate, dihydrochloride can be used instead of the disulfate.

As the Bisazide photosensitizer, 4,4'-diazidostilbene-2,2'-disulfonic acid sodium (DAS), 2,5-bis(4'-azido-2'-sulfobenzylidene)cyclopentanone disodium(DAP), 3,3'-diamino benzylidene tetrahydrochloride (DAB)are used.

The polymer may be obtained by polymerizing the hydroxy ethyl acrylate as a base and a monomer of any one selected from the group of diacetone acrylamide, dimethyl acrylamide, methyl acrylamide, acrylamide, vinyl acetate, vinyl silane, vinyl pyrrolidone, with the initiator without hydrochloric acid which has not before used in the prior black matrix forming or phosphor patterning process. Also, hydroxy propyl acrylate can be used instead of the hydroxy ethyl acrylate. Such monomer is used for controlling the developing characteristics and the sensitivity in forming the phosphor screen. Particularly, a potassium sorbate may be used as a viscosity adjusting agent.

The Diazo photosensitizer or the Bisazide photosensitizer is used preferably about 0.1–40 wt %, more preferably about 1–15 wt %, while the polymer is used about 0.5–6 wt %, more preferably about 1–4 wt %. The viscosity of the polymer which can be used for the photoresist solution is about 50–500 cps.

The chemical structure of the HEA polymer is as follows:
Formula 2

PHEA (Poly hydroxy ethyl acrylate)

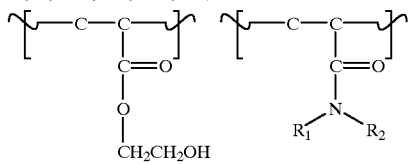

Wherein,

R$_1$=H, CH$_3$,

R$_2$=H, CH3, diacetone, vinylacetate, vinylsilane, or NR$_1$R$_2$ may be formed vinylpyrrolidone together with.

In the present invention, the initiator without hydrochloric acid was used. In particular, the water-soluble initiator, VA-series and VR-110 was used to polymerization.

The water-soluble initiator, VA-SERIES are as follow:

VA 061 2,2'-azobis[2-(2-imidazoline-2-yl) propane]

VA 080 2,2'-azobis{2-methyl-N-[1,1-bis(hydroxy methyl)-2-hydroxy ethyl] propionamide}

VA 082 2,2'-azobis{2-methyl-N-[1,1-bis(hydroxy methyl)ethyl] propionamide}

VA 086 2,2'-azobis[2-methyl-N-(2-hydroxy ethyl) propionamide]

VA 088 2,2'-azobis isobutylamide dihydrate

VT 077 2,2'-azobis[2-(hydroxy methyl) propionitrile]

Also, VR-110 is as follows:

VR 110 2,2'-azobis[2–4,4'-dimethyl pentane]

The photoresist solution of the present invention is then stirred with green, blue and red phosphors, respectively, to obtain the phosphor slurry for manufacturing the color CRT.

By using the photoresist solution of the present invention, the adhesive strength is improved by mixing the Diazo or Bisazide photosensitizer with a polymer proper to the photosensitiaer, and thus green, blue and red phosphor patterns are uniformly formed, whereby the color residue of the color CRT is removed. Further, since the photosensitizer not containing heavy metal is used, it does not cause any environmental problem.

Also the photoresist solution can be stored for a long time without change of properties thereof since the initiator does not decompose Diazo photosensitizer.

DETAILED DESCRIPTION OF THE INVENTION

Preferred examples of the present invention will be described hereinafter.

In a following example, a polymer is obtained by polymerizing based on HEA, and then the polymer being stirred with Diazo or Bisazide photosensitizer and the phosphors.

First, the polymer based on HEA is obtained as follows:

EXAMPLE 1

30 g of hydroxy ethyl acrylate and 30 g of diacetone acrylamide were dissolved in 939.6 g of pure water and then stirred. After being stirred, as an initiator, 0.4 g of VA-086 (Wako chemical, 2,2'-azobis[2-methyl-N-(2-hydroxy ethyl) propionamide] was added and stirred again. It was put into a four-neck flask equipped with the temperature control unit and the nitrogen injecting unit. The reaction in the four-neck flask was continued for 6 hours at 55° C.

By the reaction described in Example 1, 6 wt % polymer was obtained with the viscosity of 200 cps.

EXAMPLE 2

30 g of hydroxy ethyl acrylate and 30 g of dimethyl acrylamide were dissolved in 939.6 g of pure water and then stirred. After being stirred, as an initiator, 0.4 g of VA-086 (Wako chemical, 2,2'-azobis[2-methyl-N-(2-hydroxy ethyl) propionamide] was added and stirred again. It was put into a four-neck flask equipped with the temperature control unit and the nitrogen injecting unit. The reaction in the four-neck flask was continued for 6 hours at 55° C.

By the reaction described in Example 2, 6 wt % polymer was obtained with the viscosity of 150 cps.

EXAMPLE 3

30 g of hydroxy ethyl acrylate and 20 g of acrylamide were dissolved in 939.6 g of pure water and then stirred. After being stirred, as an initiator, 0.4 g of VA-086(Wako chemical, 2,2'-azobis[2-methyl-N-(2-hydroxy ethyl) propionamide] was added and stirred again. It was put into a four-neck flask equipped with the temperature control unit and the nitrogen injecting unit. The reaction in the four-neck flask was continued for 6 hours at 55° C.

By the reaction described in Example 3, 5 wt % polymer was obtained with the viscosity of 300 cps.

EXAMPLE 4

30 g of hydroxy ethyl acrylate and 20 g of vinyl pyrrolidone were dissolved in 939.6 g of pure water and then stirred. After being stirred, as an initiator, 0.2 g of VA-086 (Wako chemical, 2,2'-azobis[2-methyl-N-(2-hydroxy ethyl) propionamide] was added and stirred again. It was put into a four-neck flask equipped with the temperature control unit and the nitrogen injecting unit. The reaction in the four-neck flask was continued for 6 hours at 50° C.

By the reaction described in Example 4, 5 wt % polymer was obtained with the viscosity of 400 cps.

Here, the viscosity of the polymer available in the photoresist solution is in the ranged from 50 to 500 cps.

EXAMPLE 5

55 g of hydroxy ethyl acrylate was dissolved in 944.6 g of pure water and then stirred. After being stirred, as an initiator, 0.4 g of VA-061 (Wako chemical, 2,2'-azobis[2-(2-imidazoline-2-yl) propane]) was added and stirred again. It was put into a four-neck flask equipped with the temperature control unit and the nitrogen injecting unit. The reaction in the four-neck flask was continued for 3 hours at 55° C.

When cooling the solution at a room temperature, 5.5 wt % polymer was obtained with the viscosity of 100 cps.

EXAMPLE 6

A test was conducted in the same manner as the example 5 using 50 g of hydroxy ethyl acrylate, 10 g of acrylamide and 939.6 g of pure water instead of 55 g of hydroxy ethyl acrylate and 944.6 g of pure water used in example 5. Through this test, polymer with viscosity of 200 cps was obtained.

EXAMPLE 7

A test was conducted in the same manner as the example 6 by additionally adding 0.1 g of potassium sorbate as a viscosity adjusting agent. Through this test, 6 wt % of polymer with viscosity of 120 cps was obtained.

EXAMPLE 8

A test was conducted in the same manner as the example 5 using 10 g of dimethyl acrylamide instead of 10 g of acrylamide used in example 7, thereby 6 wt % of polymer with viscosity of 100 cps was obtained.

Following examples describe the step for forming the phophor screen by using the above photoresist solution. Here, the Diazo photosensitizer or Bisazide photosensitizer used in the following examples is mixed preferably in a range of about 0.1–40 wt %, more preferably in a range about 1–15 wt %, while the polymer is mixed in a range about 0.5–6 wt %, more preferably about 1–4 wt %.

EXAMPLE 9

50 g of 6 wt % polymer obtained in Example 1, 9 g of 5% Diazo photosensitizer and 60 g of green phosphor were dissolved in 91 g of pure water and then stirred. The stirred slurry were spin-coated on the inner surface of the panel. Afterward, the panel surface was dried and the slurry was exposed to the light with the mask installed thereon. Here, the duration for exposing the slurry to the light took 40 seconds. This exposure time is reduced by 20% than that in the prior art using slurry with the polyvinyl alcohol polymer.

After completing the exposure step, the panel was developed under a low pressure and dried, so that the green phosphor pattern was obtained. By way of those steps, the green phosphor screen with 190 $\mu$m of dots was uniformly formed.

EXAMPLE 10

50 g of 6 wt % polymer obtained in Example 2, 9 g of 5% Diazo photosensitizer and 60 g of green phosphor were dissolved in 91 g of pure water and then stirred. The stirred slurry was spin-coated on the inner surface of the panel. Afterward, the panel surface was dried and the slurry was exposed to the light with the mask installed thereon. Here, the duration for exposing the slurry to the light took 40 seconds. This exposure time is reduced by 20% than that in the prior art using slurry with the polyvinyl alcohol polymer.

After completing the exposure step, the panel was developed under a low pressure and dried, so that the green phosphor pattern was obtained.

By way of those steps, the green phosphor screen with 190 $\mu$m of dots was uniformly formed.

EXAMPLE 11

50 g of 5 wt % polymer obtained in Example 3, 9 g of 5% Diazo photosensitizer and 60 g of green phosphor were dissolved in 91 g of pure water and then stirred. The stirred slurry was spin-coated on the inner surface of the panel. Afterward, the panel surface was dried and the slurry was exposed to the light with the mask installed thereon. Here, the duration for exposing the slurry to the light took 40 seconds. This exposure time is reduced by 20% than that in the prior art using slurry with the polyvinyl alcohol polymer.

After completing the exposure step, the panel was developed under a low pressure and dried, so that the green phosphor pattern was obtained.

By way of those steps, the green phosphor screen with 250 $\mu$m of dots was uniformly formed.

EXAMPLE 12

50 g of 5 wt % polymer obtained in Example 4, 9 g of 5% Diazo photosensitizer and 60 g of green phosphor were dissolved in 91 g of pure water and then stirred. The stirred slurry was spin-coated on the inner surface of the panel. Afterward, the panel surface was dried and the slurry was exposed to the light with the mask installed thereon. Here, the duration for exposing the slurry to the light took 40 seconds. This exposure time is reduced by 20% than that in the prior art using slurry with the polyvinyl alcohol polymer.

After completing the exposure step, the panel was developed under a low pressure and dried, so that the green phosphor pattern was obtained.

By way of those steps, the green phosphor screen of 200 $\mu$m of dots was uniformly formed.

EXAMPLE 13

100 g of polymer obtained in Example 5, 27.5 g of 3% DAS(4,4'-diazidostilbene-2,2'-disulfonic acid sodium), and 88 g of blue phosphor were dissolved in 92.5 g of pure water and then stirred. The stirred slurry was spin-coated on the inner surface of the panel. Afterward, the panel surface was dried and the slurry was exposed to the light through the mask. Here, the duration for exposing the slurry to the light took 40 seconds. After removing the mask, a developing process was conducted for 80 seconds at a low pressure of 2 kgf/cm$^2$. As a result, a uniform blue phosphor pattern with 220 $\mu$m of dots was formed on the panel.

EXAMPLE 14

A test was conducted in the same manner as example 13 after adding 0.18 g of sodium sulfite into the slurry obtained in example 13. At this point, the low pressure developing process was conducted for 40 seconds. Through this test, a uniform blue phosphor screen pattern with 220 $\mu$m of dots was attained.

EXAMPLE 15

100 g of polymer obtained in Example 7, 30 g of 3% DAS(4,4'-diazidostilbene- 2,2'-disulfonic acid sodium), and 96 g of blue phosphor were dissolved in 110 g of pure water and then stirred. The stirred slurry was spin-coated on the inner surface of the panel. Afterward, the panel surface was dried and the slurry was exposed to the light through the mask. Here, the duration for exposing the slurry to the light took 40 seconds. After removing the mask, a developing process was conducted for 40 seconds at a low pressure of 2 kgf/cm$^2$ so that the blue phosphor pattern with 180 $\mu$m of dots was uniformly formed on the panel.

EXAMPLE 16

A test was conducted using a polymer obtained in example 8 in the same manner as example 15. As a result, a uniform blue phosphor screen pattern with 170 $\mu$m of dots was attained.

COMPARATIVE EXAMPLE 1 (prior art)

50 g of 8% polyvinyl alcohol, 8 g of 5% sodium dichromate and 60 g of green phosphor were dissolved in 90 g of pure water and stirred. After spin-coating of the slurry, the slurry was dried and then the mask was installed thereon. After the mask installed, the slurry was exposed to the light for 50 seconds and was developed by pure water under lower pressure.

Then, it was dried and the green phosphor pattern was formed.

The size of each dot of the green phosphor screen was 180 $\mu$m.

As may be appreciated from the above examples, the green phosphor screen according to the present invention is uniformly formed.

Followings are an example and a comparative example using different initiator added when polymerization of the polymer, in which shows the stability in storage

COMPARATIVE EXAMPLE 2 (using V-50 as an initiator)

Poly hydroxy ethyl acrylate polymer was polymerized by using a V-50(Wako chemical, 2,2'-Azobis (2-amino propane) dihydrochloride) as an nitiator.

50 g of 5% poly hydroxy ethyl acrylate obtained in the above, 5 g of 5% Diazo photosensitizer and 100 g of the green phosphor were dissolved in 195 g of pure water and stirred.

The slurry was spin-coated on the inner surface of the panel and then it was exposed to the light with the mask installed thereon. A extra-high pressure mercury lamp may be used as the light source and it is preferred to perform the light exposure for 35 seconds under 130 mW/cm$^2$ of illumination intensity.

By way of those steps, the green phosphor screen with 180 μm of dots is uniformly formed.

If the phosphor pattern is formed under the same condition as described above after the slurry is stored for a day, the dots are partially detached. And if the phosphor pattern is formed under the same condition as described above after the slurry is stored for two days, the dots are mostly detached.

COMPARATIVE EXAMPLE 3 (using VA 061 as an initiator)

VA 061 is used as an initiator instead of using V-50, and the other ingredients are same as before.

Here, 50 g of poly hydroxy ethyl acrylate obtained in the above, 5 g of 5% Diazo photosensitizer and 100 g of the green phosphor are dissolved in 195 g of pure water and stirred.

The slurry was spin-coated on the inner surface of the panel and then it was exposed to the light with the mask installed thereon. A extra-high pressure mercury lamp may be used as the light source and it is preferred to perform the light exposure for 35 seconds under 130 mW/cm$^2$ of illumination intensity.

By way of those steps, the green phosphor screen with 180 μm of dots is uniformly formed. And the slurry showed the same stability regardless of the storage time.

As may be appreciated from the above description, the present invention improves the adhesive strength by using of the Diazo or Bisazide photosensitizer with the proper polymer, thus the green, blue and red phosphor screen being uniformly formed and the color residue being disappeared.

Further, since the photosensitizer not containing heavy metal is used, it does not cause any environmental problem. Also, it can be stored for a long time without decomposition by the action of an initiator added at the time of polymerization.

What is claimed is:

1. Phosphor slurry for use in a color cathode ray tube, comprising:
   photosensitizer selected from Diazo or Bisazide photosensitizer;
   polymer, which is mixed with said photosensitizer, obtained by polymerization of hydroxy ethyl acrylate base; and
   green, blue, or red phosphor.

2. The photoresist solution as claimed in claim 1 wherein said Diazo photosensitizer is a condensed product of 4-diazodiphenylamine salt and aldehyde compound.

3. The photoresist solution as claimed in claim 2 wherein said salt is selected from the group consisting of disulfate, diphosphate, and dihydrochloride.

4. The photoresist solution as claimed in claim 1, wherein said Bisazide photosensitizer is selected from the group consisting of DAS (4,4'-diazhidostilbene-2,2'-disulfonic acid sodium), DAP (2,5-bis(4'-azido-2'-sulfobenzylidene) cyclopentanone disodium), and DAB (3,3'-diamino benzylidene tetrahydrochloride).

5. The photoresist solution as claimed in claim 1, wherein said polymer is obtained by polymerizing the hydroxy ethyl acrylate base and the monomer of any one selected from the group of diaceton acrylamide, dimethyl acrylamide, methyl acrylamide, acrylamide, vinyl acetate, vinyl silane, vinyl pyrrolidone, with the initiator of VA series or VR-110 (2,2'-azobis [2–4, 4'-dimethyl pentane]).

6. The photoresist solution as claimed in any one of claims 1–5, wherein the photosenstizer is mixed in the range between 0.1 and 40 wt % and said polymer is mixed in the range between 0.5 and 6 wt %.

7. The photoresist solution as claimed in any one of claims 1–5 further comprising a potassium sorbate as a viscosity adjusting agent.

8. A method of making a phosphor slurry for use in a color cathode ray tube, comprising:
   providing a polymer based on hydroxy ethyl acrylate;
   mixing Diazo or Bisazide photosensitizer with the polymer to form a photoresist solution; and
   mixing green, blue, or red phosphor into the photoresist solution to form a phosphor slurry.

9. A method of making a phosphor screen for a cathode ray tube, comprising:
   providing a polymer based on hydroxy ethyl acrylate;
   mixing Diazo or Bisazide photosensitizer with the polymer to form a photoresist solution;
   mixing a phosphor into the photoresist solution to form a phosphor slurry;
   coating a surface of a cathode ray tube panel with the phosphor slurry;
   drying the panel;
   exposing the panel to light with a mask; and
   developing the panel to form a phosphor pattern.

10. The method according to claim 9 wherein the phosphor is a green phosphor.

11. The method according to claim 9 wherein the phosphor is a blue phosphor.

12. The method according to claim 9 wherein the phosphor is a red phosphor.

* * * * *